(12) United States Patent
Shin et al.

(10) Patent No.: US 8,598,012 B2
(45) Date of Patent: Dec. 3, 2013

(54) METHOD FOR FABRICATING SEMICONDUCTOR DEVICE WITH BURIED GATES

(75) Inventors: Jong-Han Shin, Gyeonggi-do (KR); Noh-Jung Kwak, Gyeonggi-do (KR); Myung-Ok Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 536 days.

(21) Appl. No.: 12/832,137

(22) Filed: Jul. 8, 2010

(65) Prior Publication Data

US 2011/0159664 A1 Jun. 30, 2011

(30) Foreign Application Priority Data

Dec. 30, 2009 (KR) ........................ 10-2009-0134777

(51) Int. Cl.
*H01L 21/76* (2006.01)
*H01L 21/3205* (2006.01)

(52) U.S. Cl.
USPC ..... 438/424; 438/589; 438/430; 257/E21.546

(58) Field of Classification Search
USPC ............ 438/424, 430, 589, 689; 257/E21.19, 257/E21.54, E21.546, E21.575
See application file for complete search history.

(56) References Cited

U.S. PATENT DOCUMENTS

| 5,712,205 A * | 1/1998 | Park et al. ...................... 438/425 |
| 6,180,493 B1 * | 1/2001 | Chu ................................ 438/437 |
| 6,258,692 B1 * | 7/2001 | Chu et al. ...................... 438/400 |
| 6,534,359 B2 * | 3/2003 | Heo et al. ...................... 438/243 |
| 6,566,228 B1 * | 5/2003 | Beintner et al. ................ 438/430 |
| 6,570,208 B2 * | 5/2003 | Mandelman et al. ......... 257/302 |
| 6,649,489 B1 * | 11/2003 | Chang et al. .................. 438/424 |
| 6,727,159 B2 * | 4/2004 | Chen et al. .................... 438/435 |
| 6,734,056 B2 * | 5/2004 | Mandelman et al. ......... 438/212 |
| 6,794,266 B2 * | 9/2004 | Shih et al. ..................... 438/422 |
| 6,821,843 B1 * | 11/2004 | Chen et al. .................... 438/243 |
| 6,995,095 B2 * | 2/2006 | Yu .................................. 438/750 |
| 7,045,410 B2 * | 5/2006 | Mehrad et al. ................ 438/217 |
| 7,071,075 B2 * | 7/2006 | Hao et al. ...................... 438/427 |
| 7,179,717 B2 * | 2/2007 | Sandhu et al. ................ 438/424 |
| 7,208,369 B2 * | 4/2007 | Pai et al. ....................... 438/241 |
| 7,244,680 B2 * | 7/2007 | Yu .................................. 438/700 |
| 7,452,773 B2 * | 11/2008 | Kwon et al. ................... 438/257 |
| 7,550,363 B2 * | 6/2009 | Lee ................................ 438/424 |
| 7,560,386 B2 * | 7/2009 | Cha et al. ...................... 438/700 |
| 7,645,678 B2 * | 1/2010 | Wu ................................ 438/424 |
| 7,648,878 B2 * | 1/2010 | Jung ............................. 438/270 |
| 7,772,670 B2 * | 8/2010 | Yu .................................. 257/499 |
| 8,012,846 B2 * | 9/2011 | Tsai et al. ..................... 438/424 |
| 8,017,998 B1 * | 9/2011 | Banna et al. .................. 257/347 |
| 8,148,784 B2 * | 4/2012 | Lee ................................ 257/374 |

(Continued)

FOREIGN PATENT DOCUMENTS

| KR | 1020040008431 | 1/2004 |
| KR | 1020090011163 | 2/2009 |

*Primary Examiner* — Mary Wilczewski
(74) *Attorney, Agent, or Firm* — IP&T Group LLP

(57) ABSTRACT

A method for fabricating a semiconductor device includes sequentially stacking a pad oxide layer and a hard mask layer over a substrate, forming a device isolation layer over the substrate, forming a capping layer pattern configured to open a first region of the substrate and cover a second region of the substrate, removing the hard mask layer, removing the capping layer pattern, and removing the pad oxide layer.

19 Claims, 12 Drawing Sheets

(56) References Cited

U.S. PATENT DOCUMENTS

| | | | |
|---|---|---|---|
| 2002/0187615 A1* | 12/2002 | Liou | 438/424 |
| 2003/0085444 A1* | 5/2003 | Sundt et al. | 257/510 |
| 2004/0005765 A1* | 1/2004 | Ma et al. | 438/424 |
| 2004/0046229 A1* | 3/2004 | Sundt et al. | 257/506 |
| 2005/0014331 A1* | 1/2005 | Yang et al. | 438/241 |
| 2007/0122993 A1* | 5/2007 | Yu | 438/424 |
| 2009/0236684 A1* | 9/2009 | Lee | 257/510 |
| 2009/0253243 A1* | 10/2009 | Cho et al. | 438/437 |
| 2011/0003459 A1* | 1/2011 | Shin et al. | 438/430 |
| 2012/0181592 A1* | 7/2012 | Wang | 257/314 |

* cited by examiner

METHOD FOR FABRICATING SEMICONDUCTOR DEVICE WITH BURIED GATES

CROSS-REFERENCE TO RELATED APPLICATIONS

The present application claims priority of Korean Patent Application No. 10-2009-0134777, filed on Dec. 30, 2009, which is incorporated herein by reference in its entirety.

BACKGROUND OF THE INVENTION

Exemplary embodiments of the present invention relate to a method for fabricating a semiconductor device, and more particularly, to a method for fabricating a semiconductor device with buried gates.

A process for fabricating a semiconductor device such as a memory device includes a device isolation process, which includes a Shallow Trench Isolation (STI) process.

According to the STI process, trenches are formed by using a hard mask layer as an etch barrier and etching a substrate. The formed trenches are filled with an insulation layer.

Under the hard mask layer, a pad oxide layer may be formed. The pad oxide layer is selectively removed after the device isolation process is completed.

FIGS. 1A to 1C illustrate a conventional method for fabricating a semiconductor device.

Referring to FIG. 1A, a pad oxide layer and a hard mask layer are sequentially stacked over a substrate 11 which includes a first region 101 and a second region 102.

The hard mask layer and the pad oxide layer are etched using a device isolation mask (not shown). Hereafter, the etched hard mask layer and the etched pad oxide layer are referred to as a first hard mask pattern 13 and a pad oxide layer pattern 12. Subsequently, trenches 14 are formed by etching the substrate 11 up to a certain depth by using the first hard mask pattern 13 as an etch barrier. The trenches 14 may be formed both in the first region 101 and the second region 102, and the trenches 14 formed in the second region 102 may have wider width than those formed in the first region 101. The first region 101 includes a cell region, while the second region 102 includes a peripheral circuit region.

An insulation layer is formed over the substrate 11 to gap-fill the trenches 14 and a planarization process is performed. As a result, a device isolation layer 15 gap-filling the trenches 14 is formed.

Referring to FIG. 1B, an open process of opening the first region 101 is performed on the resulting structure shown in FIG. 1. A capping layer is formed over the substrate 11, and a cell region open mask 17 is formed using a photoresist pattern. Subsequently, the capping layer of the first region 101 is etched so that the capping layer remains in the second region 102. Hereafter, the capping layer remaining in the second region 102 is referred to as a capping layer pattern 16.

Referring to FIG. 1C, the cell region open mask 17 is removed, and then the first hard mask pattern 13 of the first region 101 is selectively removed using the capping layer pattern 16 as a protective layer.

Subsequently, the pad oxide layer pattern 12 of the first region 101 is removed. Processes of forming landing plugs and buried gates (BG) in the first region 101 are performed. As described above, in the process for fabricating a semiconductor device including buried gates and landing plugs, the second region 102 is protected using the capping layer pattern 16 when the pad oxide layer pattern 12 is removed.

According to the above-discussed conventional technology, when the pad oxide layer pattern 12 is removed, a large difference in step height may be caused between the first region 101 and the second region 102. The difference in the step heights of the first and second region 101 and 102 is caused by the capping layer pattern 16 capping the second region 102. When the pad oxide layer pattern 12 is removed, a portion of the device isolation layer 15 may be removed as well. Since the device isolation layer 15 of the second region 102 is protected by the capping layer pattern 16, the large difference in the step height is caused, referring to a reference numeral '103'.

The step height difference 103 brings about failure in a subsequent process. For example, during a separation process using Chemical Mechanical Polishing (CMP), it is difficult to maintain the height of a separated layer at a uniform level. On the contrary, when the separation process is performed excessively to maintain the height of the separated layer at a uniform level, the height of the device isolation layer 15 remaining in the second region 102 may not be maintained uniformly. Furthermore, the step height difference 103 can deteriorate the stability of a subsequent process.

SUMMARY OF THE INVENTION

Exemplary embodiments of the present invention are directed to a method for fabricating a semiconductor device that prevents/reduces a step height difference when a pad oxide layer is removed.

In accordance with an exemplary embodiment of the present invention, a method for fabricating a semiconductor device includes sequentially stacking a pad oxide layer and a hard mask layer over a substrate, forming a device isolation layer over the substrate, forming a capping layer pattern configured to open a first region of the substrate and cover a second region of the substrate, removing the hard mask layer, removing the capping layer pattern, and removing the pad oxide layer.

In accordance with another exemplary embodiment of the present invention, a method for fabricating a semiconductor device includes sequentially stacking a pad oxide layer and a first polysilicon layer over a substrate, forming a device isolation layer over the substrate, forming a second polysilicon layer pattern configured to open a first region of the substrate and cover a second region of the substrate, removing the second polysilicon layer pattern and the first polysilicon layer of the first region, and removing the pad oxide layer of the first region.

DESCRIPTION OF SPECIFIC EMBODIMENTS

Figure 1A:
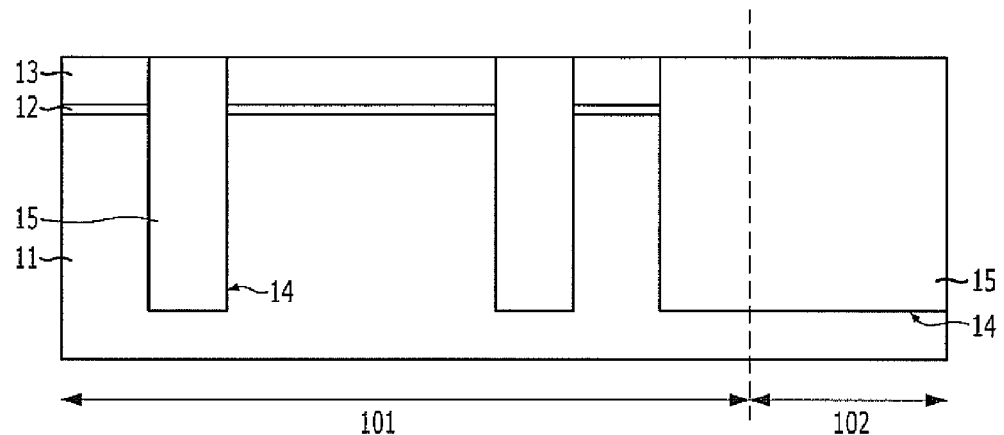
FIGS. 1A to 1C illustrate a conventional method for fabricating a semiconductor device.
Figure 1B:
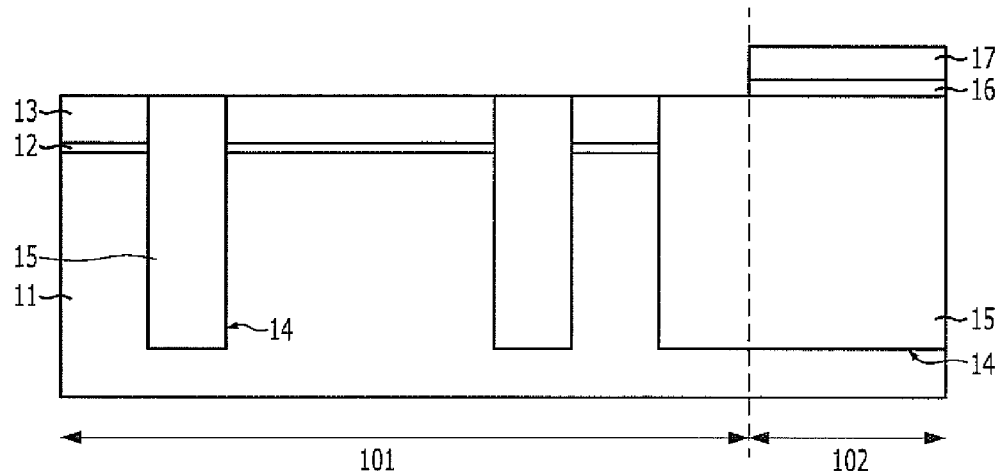
Figure 1C:
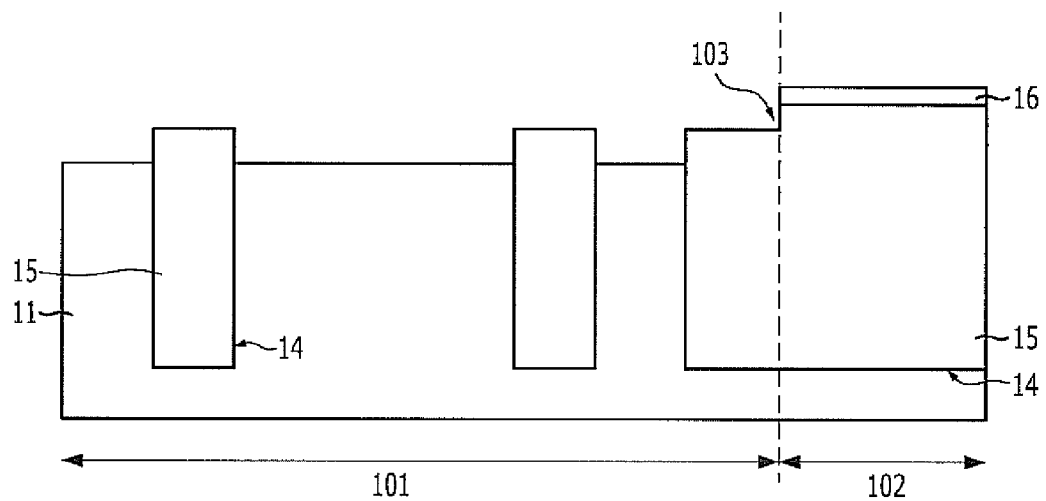

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2H illustrate a method for fabricating a semiconductor device in accordance with an embodiment of the present invention.

Figure 2A:
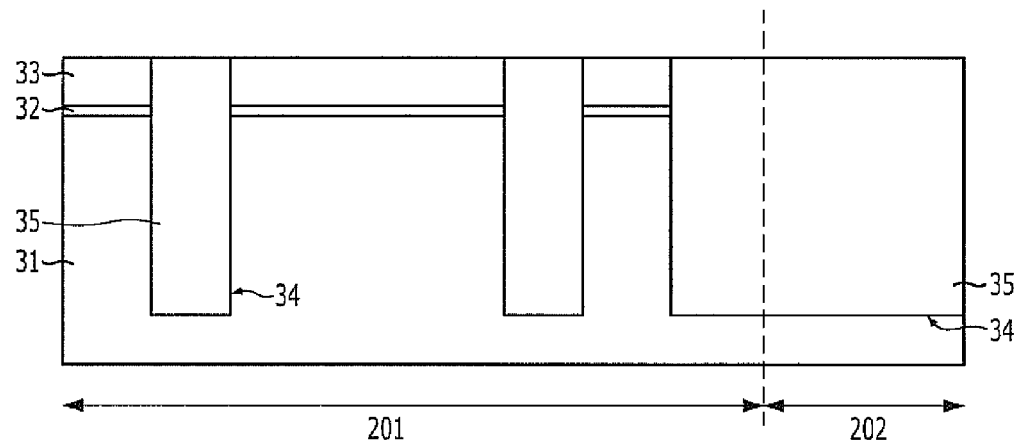
FIGS. 2A to 2H illustrate a method for fabricating a semiconductor device in accordance with an embodiment of the present invention.

Referring to FIG. 2A, a pad oxide layer is formed over a substrate 31, such as a silicon substrate. The substrate 31 includes a first region 201 and a second region 202 defined therein. The first region 201 includes a cell region, and the second region 202 includes a peripheral circuit region.

A hard mask polysilicon layer is formed over the pad oxide layer. The hard mask polysilicon layer may be formed in a thickness ranging from approximately 600 Å to approximately 1,500 Å. The hard mask polysilicon layer serves as an etch barrier during a subsequent Shallow Trench Isolation (STI) process. A hard mask nitride layer may be used instead of the hard mask polysilicon layer.

A Chemical Mechanical Polishing (CMP) stop layer may be further formed over the hard mask polysilicon layer. The CMP stop layer includes a nitride layer.

Subsequently, an STI process for forming a device isolation layer is performed. The STI process includes a trench forming process, a gap-filling process, and a planarization process.

First, the hard mask polysilicon layer and the pad oxide layer are etched using a photoresist pattern (not shown). Hereafter, the etched hard mask polysilicon layer and the pad oxide layer are referred to as a hard mask polysilicon layer pattern 33 and a pad oxide layer pattern 32.

Then, the substrate 31 is etched using the hard mask polysilicon layer pattern 33 as an etch barrier. As a result, trenches 34 of a certain depth are formed in the substrate 31. The trenches 34 may be formed both in the first region 201 and the second region 202. The trenches 34 formed in the second region 202 may have wider width than those in the first region 201.

Subsequently, an insulation layer, such as a spin-on-dielectric (SOD) layer, is formed to gap-fill the trenches 34. A planarization process, such as a CMP process, is performed on the gap-filled structure. As a result, a device isolation layer 35 gap-filling the trenches 34 is formed.

Figure 2B:
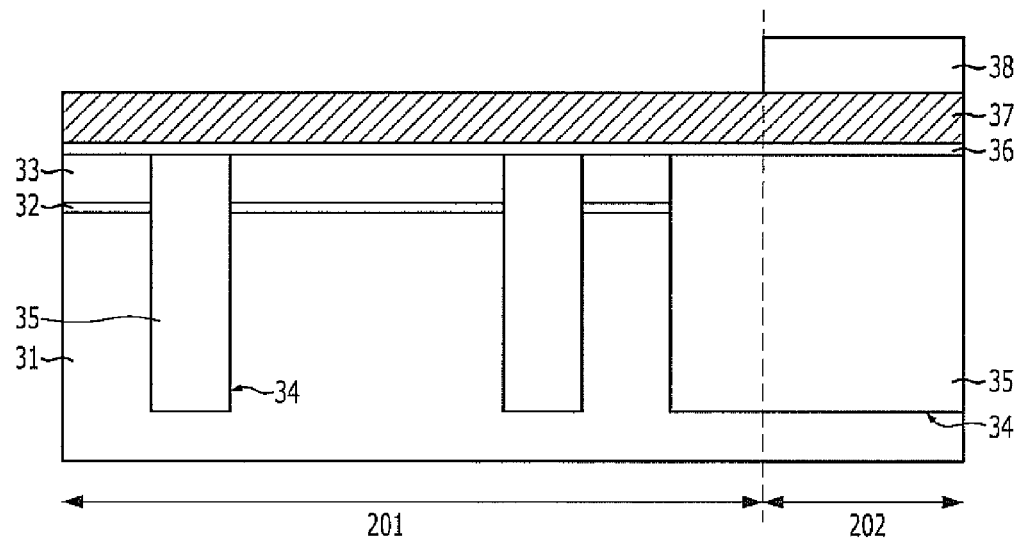

Referring to FIG. 2B, a capping nitride layer 36 is formed over the substrate 31, and a capping polysilicon layer 37 is formed over the capping nitride layer 36. The formation of the capping polysilicon layer 37 may be omitted. According to another embodiment, the capping polysilicon layer 37 may be formed and then the capping nitride layer 36 may be formed. In this embodiment, the hard mask layer serving as an etch barrier during an STI process is a hard mask nitride layer. When a hard mask nitride layer is used, a single structure of the capping polysilicon layer 37 may be used without the capping nitride layer 36.

Subsequently, an open mask 38 is formed over the capping polysilicon layer 37. The open mask 38 opens the first region 201 and covers the second region 202 of the substrate 31. The open mask 38 includes a photoresist pattern.

Figure 2C:
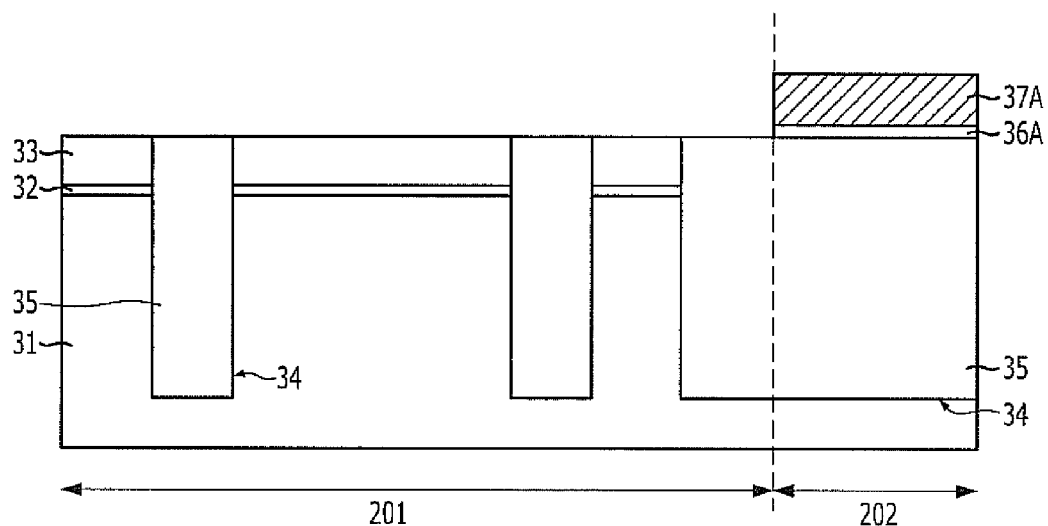

Referring to FIG. 2C, the capping polysilicon layer 37 is etched using the open mask 38 as an etch barrier. As a result, a capping polysilicon layer pattern 37A covering the second region 202 is formed.

The open mask 38 is stripped and then the capping nitride layer 36 is etched using the capping polysilicon layer pattern 37A as an etch barrier. As a result, the capping nitride layer 36 is removed from the first region 201, and remains in the second region 202. Hereafter, the capping nitride layer 36 remaining in the second region 202 is referred to as a capping nitride layer pattern 36A.

Figure 2D:
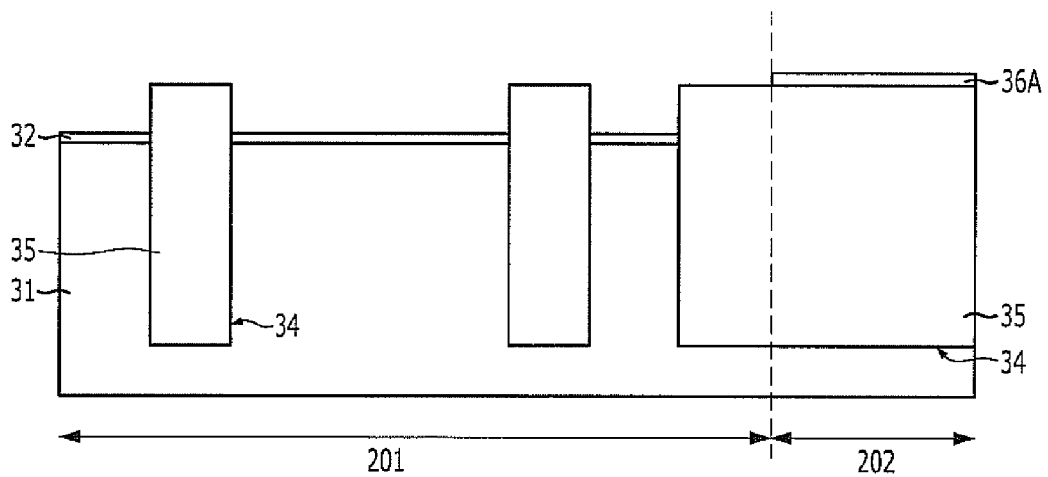

Referring to FIG. 2D, the polysilicon layers are removed. In other words, the capping polysilicon layer pattern 37A and the hard mask polysilicon layer pattern 33 are removed. Herein, the capping nitride layer pattern 36A functions as a protective layer in the second region 202. In the first region 201, the pad oxide layer pattern 32 remains.

Figure 2E:
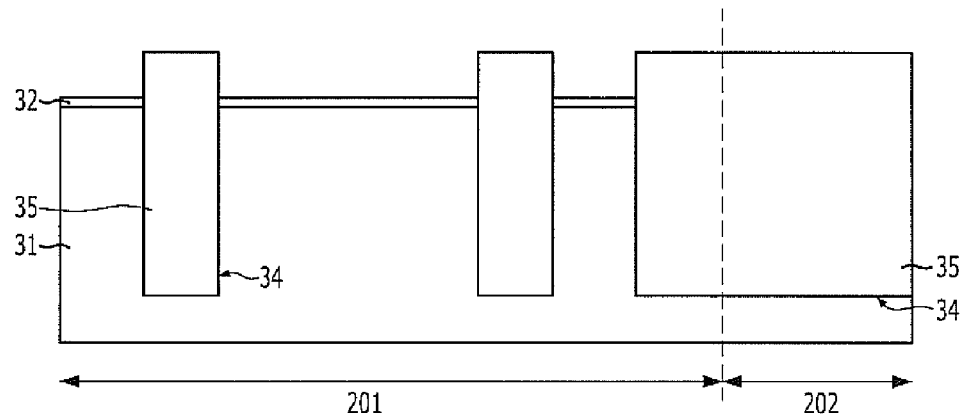

Referring to FIG. 2E, the capping nitride layer pattern 36A is removed. The capping nitride layer pattern 36A may be removed through a wet etch process or a dry etch process.

Figure 2F:
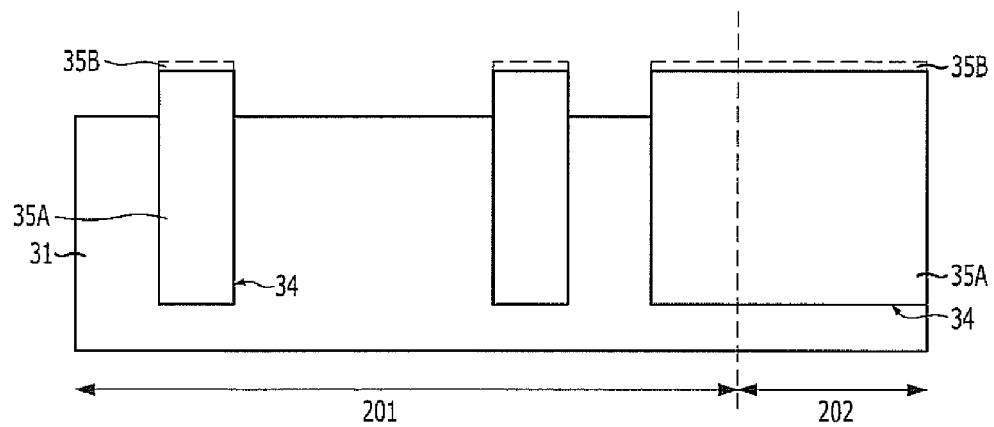

Referring to FIG. 2F, the pad oxide layer pattern 32 is removed. While the pad oxide layer pattern 32 is removed, an upper portion of the device isolation layer 35 may be etched and the height of the device isolation layer 35 may be lowered. The device isolation layer 35 which has the lowered height is referred to as a low device isolation layer 35A.

Since the capping nitride layer pattern 36A is removed, the upper portion of the device isolation layer 35 is uniformly etched (see reference numeral '35B') in both first region 201 and second region 202 to form the low device isolation layer 35A. As a result, there is no difference in the step height between the first region 201 and the second region 202. The pad oxide layer pattern 32 may be removed through a wet etch process. The wet etch process is performed using a solution including hydrogen fluoride (HF) or a buffered oxide etchant (BOE).

Figure 2G:
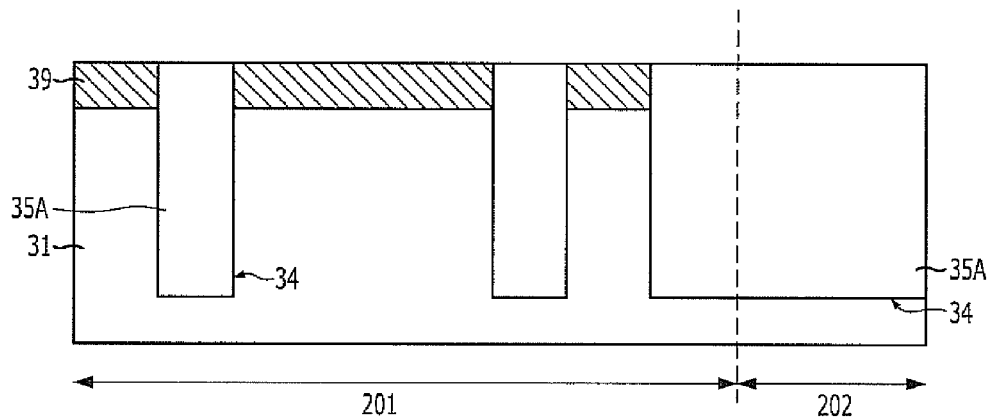

Referring to FIG. 2G, after a plug conductive layer is formed over the substrate 31, an isolation process is performed. As a result, pre-landing plugs 39 are formed. The plug conductive layer includes a polysilicon layer or a metal layer. Also, the plug conductive layer includes a doped polysilicon layer or an undoped polysilicon layer.

When the plug conductive layer includes an undoped polysilicon layer, an ion implantation process may be performed additionally to reach a sufficient doping concentration.

The pre-landing plugs 39 are formed being arranged with respect to the low device isolation layer 35A. This is referred to as a self-aligned landing plug process. The isolation process includes a CMP process. The CMP process may be performed using a high-selectivity polishing slurry which has a high polishing selectivity between the low device isolation layer 35A and the pre-landing plugs 39.

Since the self-aligned landing plug process is performed after the capping nitride layer pattern 36A is removed, the pre-landing plugs 39 may secure its height higher than approximately 400 Å.

Figure 2H:
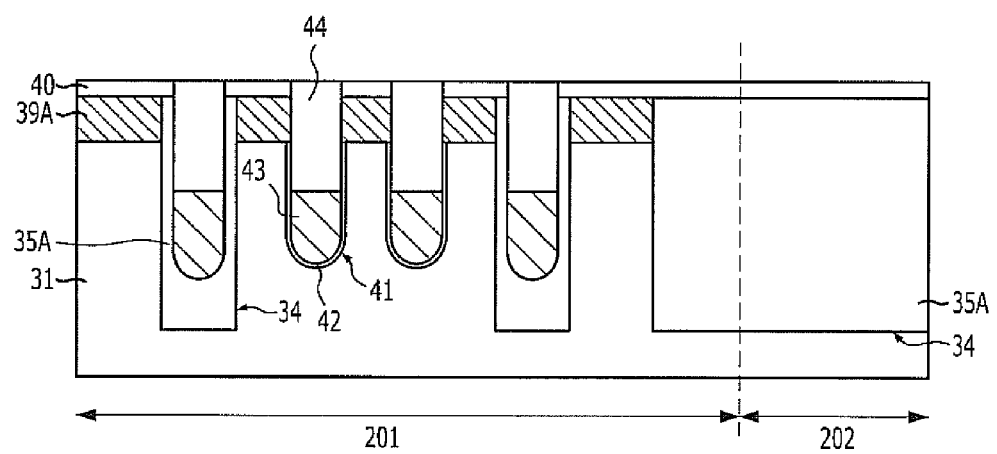

Referring to FIG. 2H, a buried gate hard mask layer is formed. A mask forming process and an etch process are performed for forming buried gates in the first region 201. For example, the buried gate hard mask layer and the pre-landing plugs 39 are etched using a photoresist pattern (not shown). As the pre-landing plugs 39 are etched, landing plugs 39A are formed over the substrate 31. Hereafter, the etched buried gate hard mask layer is referred to as a buried gate hard mask pattern 40. Subsequently, the substrate 31 exposed between the landing plugs 39A is etched. As a result, buried gate trenches 41 of a certain depth are formed in the substrate 31 of the first region 201. The buried gate trenches 41 may be formed by etching the low device isolation layer 35A as well as the substrate 31.

As the substrate 31 is etched based on the etch process using the self-aligned landing plugs 39A, the buried gate trenches 41 are formed in the first region 201.

Subsequently, a gate insulation layer 42 is formed on the surface of the buried gate trenches 41. Then, buried gates 43 filling a portion of each buried gate trench 41 are formed over the gate insulation layer 42. The buried gates 43 are formed as follows. First, a metal layer is deposited over the substrate 31 to gap-fill the buried gate trenches 41. The metal layer includes a titanium nitride (TIN) layer, a tantalum nitride (TaN) layer, and a tungsten (W) layer. Subsequently, the metal layer is planarized through a method such as the CMP process until the surface of the buried gate hard mask pattern 40 is exposed. Then, an etch-back process is performed onto the planarized metal layer.

After forming the buried gates 43, a gap-filling layer 44 gap-filling the upper portions of the buried gate trenches 41 is formed. Herein, the gap-filling layer 44 may be an oxide layer, a nitride layer, or a stacked layer of a nitride layer and an oxide layer. For example, the gap-filling layer 44 may be formed by sealing a nitride layer and then gap-filling an oxide layer.

Subsequently, the gap-filling layer 44 is planarized until the surface of the buried gate hard mask pattern 40 is exposed.

Although not illustrated in the drawing, a gate patterning process for forming gates in the second region 202 may be performed. In other words, a gate electrode is formed by etching a pad polysilicon layer (not shown) remaining in the second region 202. A gate patterning process may be performed after a low-resistance metal layer is further formed over the pad polysilicon layer.

FIGS. 3A to 3F illustrate a method for fabricating a semiconductor device in accordance with another embodiment of the present invention.

Figure 3A:
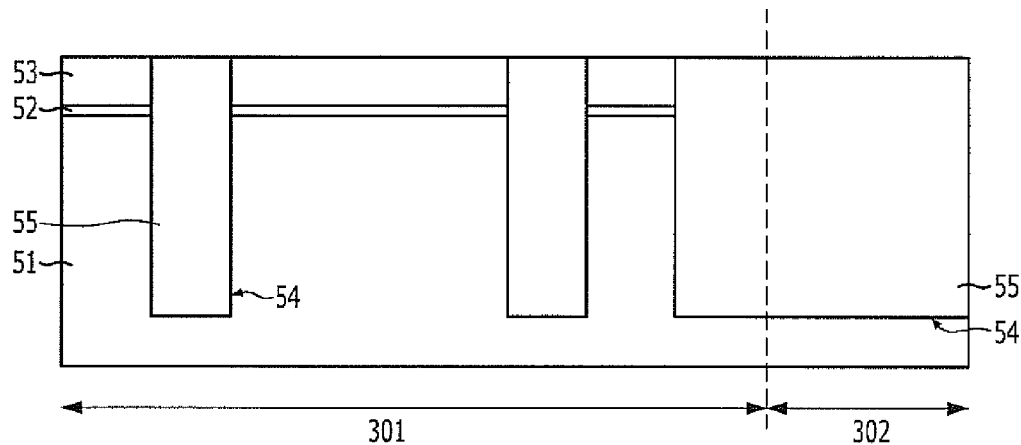
FIGS. 3A to 3F illustrate a method for fabricating a semiconductor device in accordance with another embodiment of the present invention.

Referring to FIG. 3A, a pad oxide layer is formed over a substrate 51, such as a silicon substrate. The substrate 51 includes a first region 301 and a second region 302 defined therein. The first region 301 includes a cell region, and the second region 302 includes a peripheral circuit region.

A hard mask polysilicon layer is formed over the pad oxide layer. The hard mask polysilicon layer may be formed in a thickness ranging from approximately 600 Å to approximately 1,500 Å. The hard mask polysilicon layer serves as an etch barrier during a subsequent Shallow Trench Isolation (STI) process. A hard mask nitride layer may be used instead of the hard mask polysilicon layer.

A Chemical Mechanical Polishing (CMP) stop layer may be further formed over the hard mask polysilicon layer. The CMP stop layer includes a nitride layer.

Subsequently, an STI process for forming a device isolation layer is performed. The STI process includes a trench forming process, a gap-filling process, and a pianarization process.

First, the hard mask polysilicon layer and the pad oxide layer are etched using a photoresist pattern (not shown). Hereafter, the etched hard mask polysilicon layer and the pad oxide layer are referred to as a hard mask polysilicon layer pattern 53 and a pad oxide layer pattern 52.

Then, the substrate 51 is etched using the hard mask polysilicon layer pattern 53 as an etch barrier. As a result, trenches 54 of a certain depth are formed in the substrate 51. The trenches 54 may be formed both in the first region 301 and the second region 302. The trenches 54 formed in the second region 302, which is a peripheral circuit region, may have wider width than those in the first region 301.

Subsequently, an insulation layer, such as a spin-on-dielectric (SOD) layer, is formed to gap-fill the trenches 54. A planarization process, such as a CMP process, is performed. As a result, a device isolation layer 55 gap-filling the trenches 54 is formed.

Figure 3B:
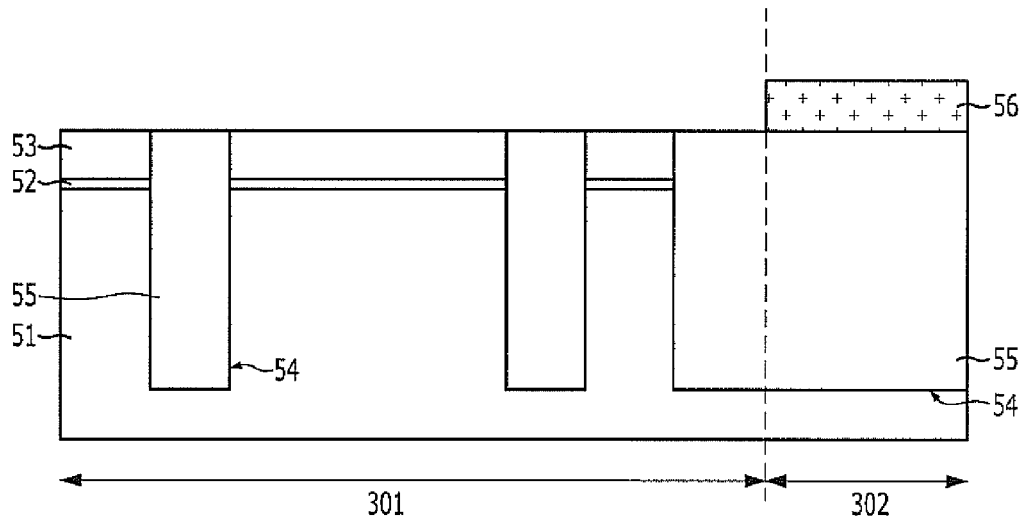

Referring to FIG. 3B, an open mask 56 is formed over the substrate 51. The open mask 56 opens the first region 301 and covers the second region 302 of the substrate 51. The open mask 56 includes a photoresist pattern.

Figure 3C:
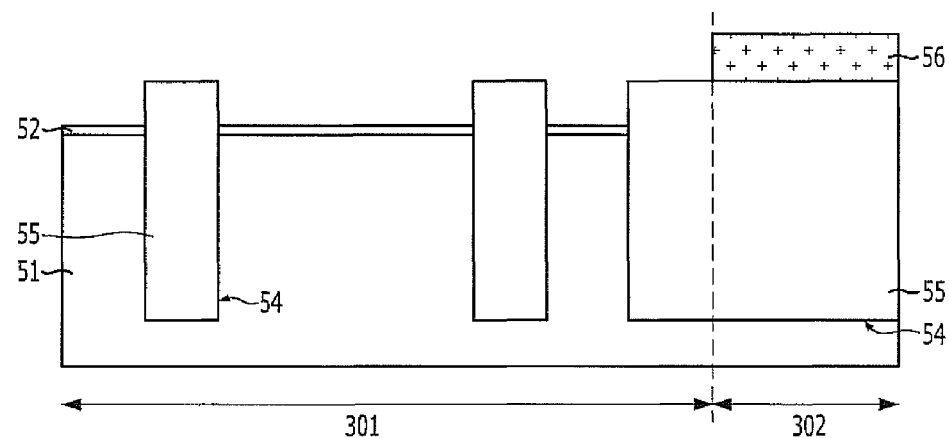

Referring to FIG. 3C, the polysilicon layer is removed using the open mask 56 as an etch barrier. In other words, the hard mask polysilicon layer pattern 53 is removed using the open mask 56 as an etch barrier. Herein, the open mask 56 functions as a protective layer in the second region 302. In the first region 301, the pad oxide layer pattern 52 remains.

Figure 3D:
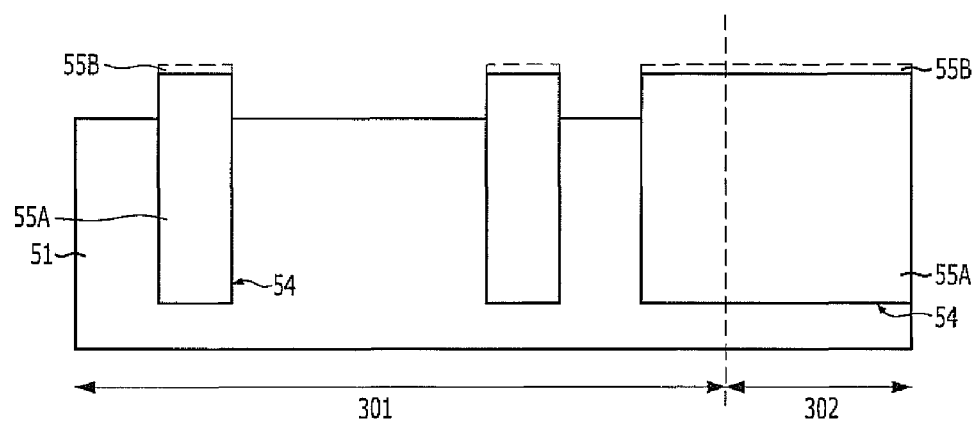

Referring to FIG. 3D, the open mask 56 is removed. The open mask 56 may be removed through an ashing process using oxygen gas.

Subsequently, the pad oxide layer pattern 52 is removed. While the pad oxide layer pattern 52 is removed, an upper portion of the device isolation layer 55 may be etched and the height of the device isolation layer 55 may be lowered. The device isolation layer 55 which has the lowered height is referred to as a low device isolation layer 55A.

Since the open mask 56 is removed, the upper portion of the device isolation layer 55 is uniformly etched (see reference numeral '55B') in both first region 301 and second region 302 to form the low device isolation layer 55A. As a result, the step height difference is not caused in the low device isolation layer 55A. The pad oxide layer pattern 52 may be removed through a wet etch process. The wet etch process is performed using a solution including hydrogen fluoride (HF) or a buffered oxide etchant (BOE).

Figure 3E:
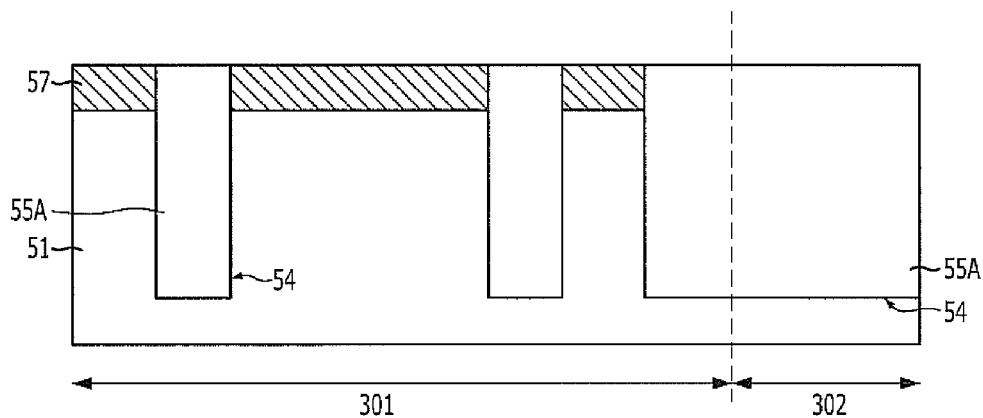

Referring to FIG. 3E, after a plug conductive layer is formed over the substrate 51, an isolation process is performed. As a result, pre-landing plugs 57 are formed. The plug conductive layer includes a polysilicon layer or a metal layer. Also, the plug conductive layer includes a doped polysilicon layer or an undoped polysilicon layer. When the plug conductive layer includes an undoped polysilicon layer, an ion implantation process may be performed additionally to reach a sufficient doping concentration.

The pre-landing plugs 57 are formed being arranged with respect to the low device isolation layer 55A. This is referred to as a self-aligned landing plug process. The isolation process includes a CMP process. The CMP process may be performed using high-selectivity polishing slurry which has a high polishing selectivity between the low device isolation layer 55A and the pre-landing plugs 57.

Since the self-aligned landing plug process is performed without any material covering the second region 302, such as the open mask 56, the pre-landing plugs 39 may secure its height higher than approximately 400 Å.

Figure 3F:
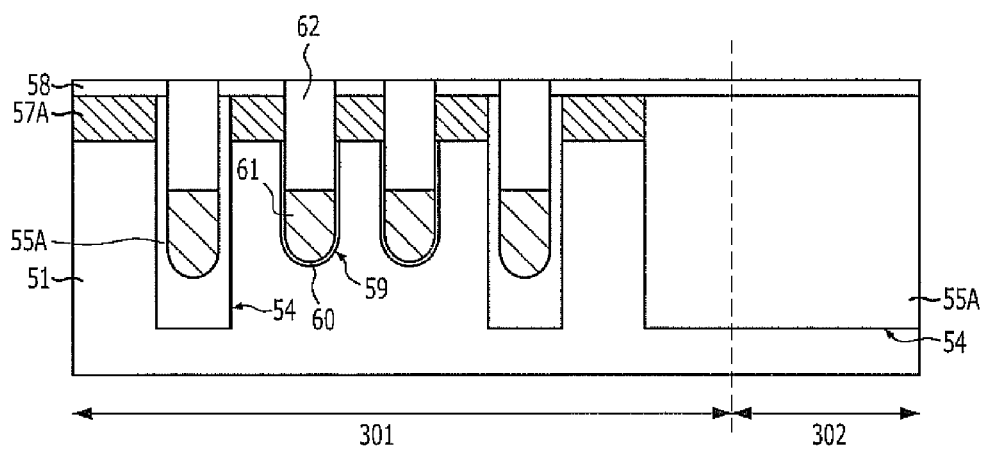

Referring to FIG. 3F, a buried gate hard mask layer is formed. A mask forming process and an etch process are performed for forming buried gates. For example, the buried gate hard mask layer and the pre-landing plugs 57 are etched using a photoresist pattern (not shown). As the pre-landing plugs 57 are etched, landing plugs 57A are formed over the substrate 51. Hereafter, the etched buried gate hard mask layer is referred to as a buried gate hard mask pattern 58. Subsequently, the substrate 51 exposed between the landing plugs 57A is etched. As a result, buried gate trenches 59 of a certain depth are formed in the substrate 51 of the first region 301. The buried gate trenches 59 may be formed by simultaneously etching the substrate 51 and the low device isolation layer 55A.

As the substrate 51 is etched based on the etch process using the self-aligned landing plugs 57A, the buried gate trenches 59 are formed in the first region 301.

Subsequently, a gate insulation layer 60 is formed on the surface of the buried gate trenches 59. Then, buried gates 61 filling a portion of each buried gate trench 59 are formed over the gate insulation layer 60. The buried gates 61 are formed as follows. First, a metal layer is deposited over the substrate 51 to gap-fill the buried gate trenches 59. The metal layer includes a titanium nitride (TiN) layer, a tantalum nitride (TaN) layer, and a tungsten (W) layer. Subsequently, the metal layer is planarized through a method such as the CMP process until the surface of the buried gate hard mask pattern 58 is exposed. Then, an etch-back process is performed onto the planarized metal layer.

After forming the buried gates 61, a gap-filling layer 62 gap-filling the upper portions of the buried gate trenches 59 is formed. Herein, the gap-filling layer 62 may be an oxide layer, a nitride layer, or a stacked layer of a nitride layer and an oxide layer. For example, the gap-filling layer 62 may be formed by sealing a nitride layer and then gap-filling an oxide layer.

Subsequently, the gap-filling layer 62 is planarized until the surface of the buried gate hard mask pattern 58 is exposed.

Although not illustrated in the drawings, a gate patterning process for forming gates in the second region 302 may be performed. In other words, a gate electrode is formed by etching a pad polysilicon layer (not shown) remaining in the second region 302. A gate patterning process may be performed after a low-resistance metal layer is further formed over the pad polysilicon layer.

FIGS. 4A to 4F illustrate a method for fabricating a semiconductor device in accordance with another embodiment of the present invention.

Figure 4A:
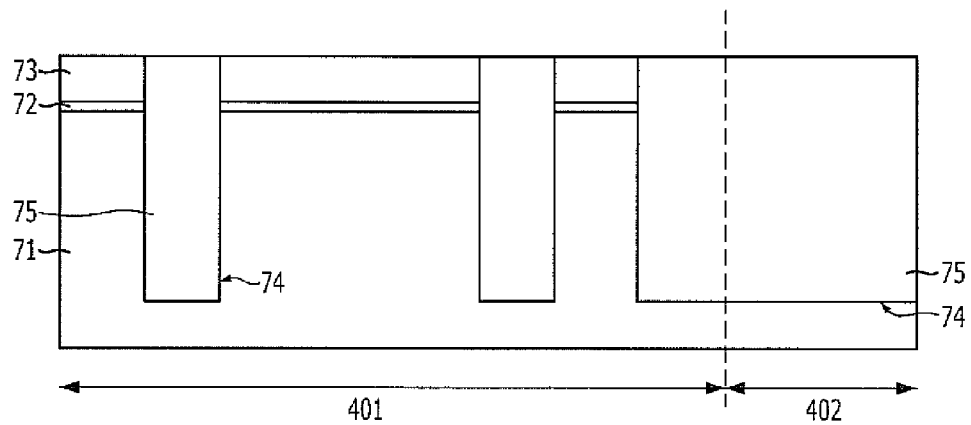
FIGS. 4A to 4F illustrate a method for fabricating a semiconductor device in accordance with a further embodiment of the present invention.

Referring to FIG. 4A, a pad oxide layer is formed over a substrate 71, such as a silicon substrate. The substrate 71 includes a first region 401 and a second region 402 defined therein.

A hard mask polysilicon layer is formed over the pad oxide layer. The hard mask polysilicon layer may be formed in a thickness ranging from approximately 600 Å to approximately 1,500 Å. The hard mask polysilicon layer serves as an etch barrier during a subsequent Shallow Trench Isolation (STI) process. A hard mask nitride layer may be used instead of the hard mask polysilicon layer.

A Chemical Mechanical Polishing (CMP) stop layer may be further formed over the hard mask polysilicon layer. The CMP stop layer includes a nitride layer.

Subsequently, an STI process for forming a device isolation layer is performed. The STI process includes a trench forming process, a gap-filling process, and a planarization process.

First, the hard mask polysilicon layer and the pad oxide layer are etched using a photoresist pattern (not shown). Hereafter, the etched hard mask polysilicon layer and the pad oxide layer are referred to as a hard mask polysilicon layer pattern 73 and a pad oxide layer pattern 72.

Then, the substrate 71 is etched using the hard mask polysilicon layer pattern 73 as an etch barrier. As a result, trenches 74 of a certain depth are formed in the substrate 71. The trenches 74 may be formed both in the first region 401 and the second region 402. The trenches 74 formed in the second region 402, which is a peripheral circuit region, may have wider width than those in the first region 401.

Subsequently, an insulation layer, such as a spin-on-dielectric (SOD) layer, is formed to gap-fill the trenches 74. A planarization process, such as a CMP process, is performed. As a result, a device isolation layer 75 gap-filling the trenches 74 is formed.

Figure 4B:
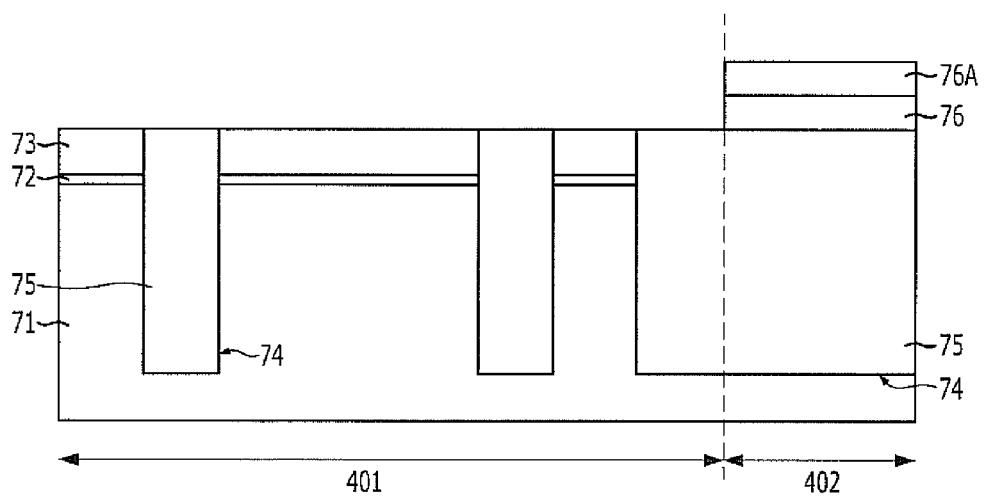

Referring to FIG. 4B, a capping polysilicon layer pattern 76 is formed over the substrate 71. The capping polysilicon layer pattern 76 opens the first region 401 and covers the second region 402 of the substrate 71. The capping polysilicon layer pattern 76 is formed using an open mask 76A. The open mask 76A includes a photoresist pattern. According to another embodiment, a capping nitride layer pattern may be formed instead of the capping polysilicon layer pattern 76. In this embodiment, the hard mask layer functioning as an etch barrier during an STI process is a hard mask nitride layer.

Figure 4C:
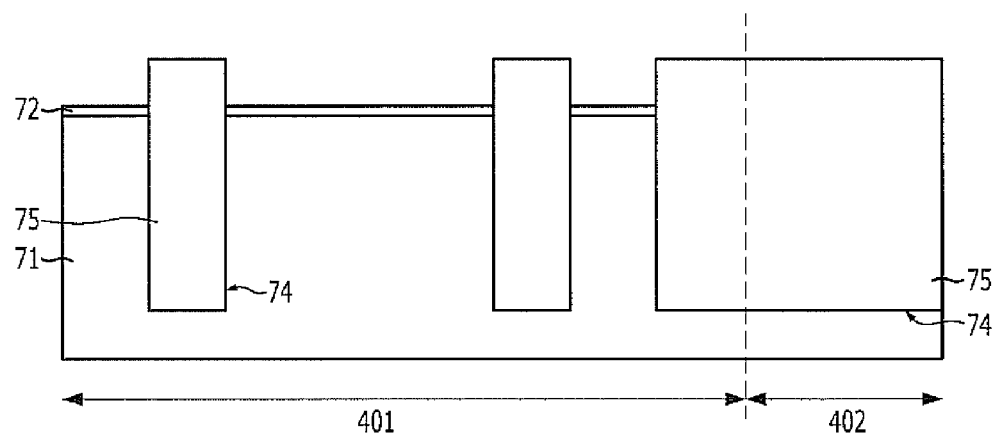

Referring to FIG. 4C, after the open mask 76A is removed, the polysilicon layers are removed. In other words, the capping polysilicon layer pattern 76 and the hard mask polysilicon layer pattern 73 are removed. The pad oxide layer pattern 72 remains in the first region 401.

Figure 4D:
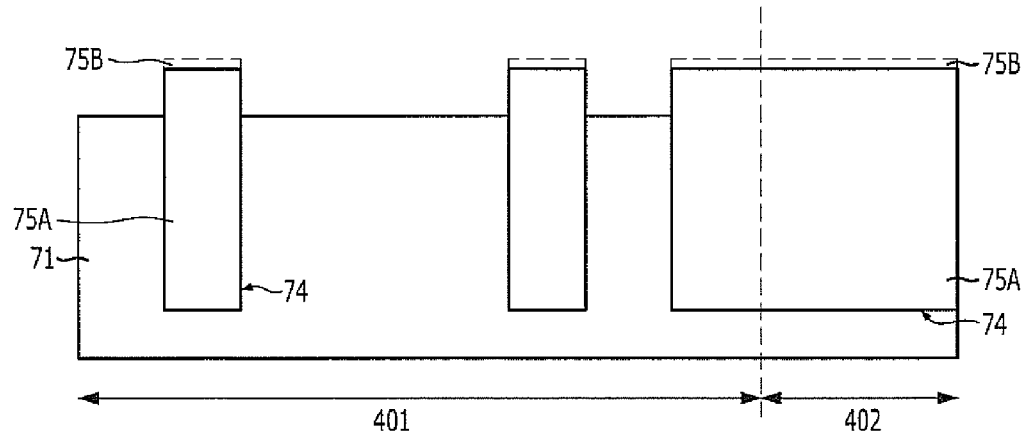

Referring to FIG. 4D, the pad oxide layer pattern 72 is removed. While the pad oxide layer pattern 72 is removed, an upper portion of the device isolation layer 75 may be etched and the height of the device isolation layer 75 may be reduced. The device isolation layer 75 which has the reduced height is referred to as a low device isolation layer 75A.

Since the capping polysilicon layer pattern 76 is removed, the upper portion of the device isolation layer 75 is uniformly etched (see reference numeral '75B') in both first region 401 and second region 402 to form the low device isolation layer 75A. As a result, the step height difference is not caused in the low device isolation layer 75A. The pad oxide layer pattern 72 may be removed through a wet etch process. The wet etch process is performed using a solution including hydrogen fluoride (HF) or a buffered oxide etchant (BOE).

Figure 4E:
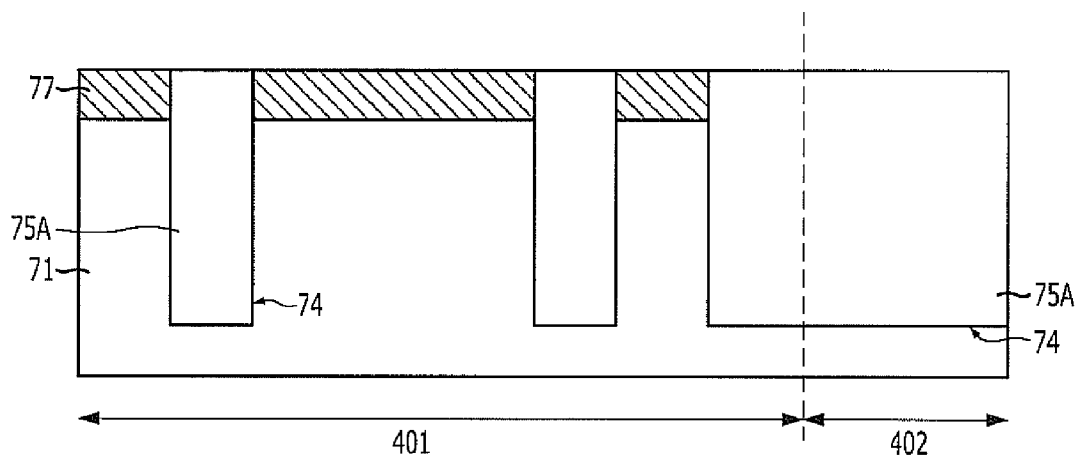

Referring to FIG. 4E, after a plug conductive layer is formed over the substrate 71, an isolation process is performed. As a result, pre-landing plugs 77 are formed. The plug conductive layer includes a polysilicon layer or a metal layer. Also, the plug conductive layer includes a doped polysilicon layer or an undoped polysilicon layer. When the plug conductive layer includes an undoped polysilicon layer, an ion implantation process may be performed additionally to reach a sufficient doping concentration.

The pre-landing plugs 77 are formed in a certain arrangement with respect to the low device isolation layer 75A. This is referred to as a self-aligned landing plug process. The isolation process includes a CMP process. The CMP process may be performed using a high-selectivity polishing slurry which has a high polishing selectivity between the low device isolation layer 75A and the pre-landing plugs 77.

Since the self-aligned landing plug process is performed after the capping polysilicon layer pattern 76 is removed, the pre-landing plugs 77 may secure its height higher than approximately 400 Å.

Figure 4F:
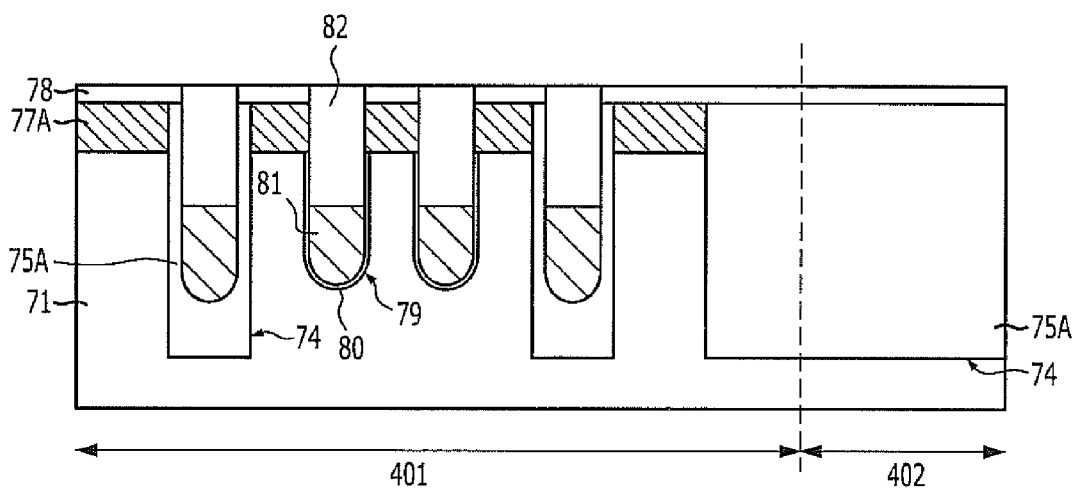

Referring to FIG. 4F, a buried gate hard mask layer is formed. A mask forming process and an etch process are performed for forming buried gates. For example, the buried gate hard mask layer and the pre-landing plugs 77 are etched using a photoresist pattern (not shown). As the pre-landing plugs 77 are etched, landing plugs 77A are formed over the substrate 71. Hereafter, the etched buried gate hard mask layer is referred to as a buried gate hard mask pattern 78. Subsequently, the substrate 71 exposed between the landing plugs 77A is etched. As a result, buried gate trenches 79 of a certain depth are formed in the substrate 71 of the first region 401. The buried gate trenches 79 may be formed by simultaneously etching the substrate 71 and the low device isolation layer 75A.

As the substrate 71 is etched based on the etch process using the self-aligned landing plugs 77A, the buried gate trenches 79 are formed in the first region 401.

Subsequently, a gate insulation layer 80 is formed on the surface of the buried gate trenches 79. Then, buried gates 81 filling a portion of each buried gate trench 79 are formed over the gate insulation layer 80. The buried gates 81 are formed as follows. First, a metal layer is deposited over the substrate 71 to gap-fill the buried gate trenches 81. The metal layer includes a titanium nitride (TIN) layer, a tantalum nitride (TaN) layer, and a tungsten (W) layer. Subsequently, the metal layer is planarized through a method such as the CMP process until the surface of the buried gate hard mask pattern 78 is exposed. Then, an etch-back process is performed onto the planarized metal layer.

After forming the buried gates 81, a gap-filling layer 82 gap-filling the upper portions of the buried gate trenches 79 is formed. Herein, the gap-filling layer 82 may be an oxide layer, a nitride layer, or a stacked layer of a nitride layer and an oxide layer. For example, the gap-filling layer 82 may be formed by sealing a nitride layer and then gap-filling an oxide layer.

Subsequently, the gap-filling layer 82 is planarized until the surface of the buried gate hard mask pattern 78 is exposed.

Although not illustrated in the drawing, a gate patterning process for forming gates in the second region 402 may be performed. In other words, a gate electrode is formed by etching a pad polysilicon layer (not shown) remaining in the second region 402. A gate patterning process may be performed after a low-resistance metal layer is further formed over the pad polysilicon layer.

In the exemplary embodiments described above, buried gates are formed after landing plugs are formed. However, according to another embodiment, the landing plugs may be formed after the buried gates are formed first.

Also, in the above-described exemplary embodiments, a gate patterning process is performed in the second region after buried gates are formed in the first region. However, according to another embodiment, the buried gates in the first region may be formed after a gate insulation layer and a gate electrode are formed first in the second region.

In accordance with an embodiment of the present invention a semiconductor device may prevent/reduce the step height difference by removing a pad oxide layer after a capping layer is removed.

Also, since landing plugs are formed in the first region, e.g., a cell region, without capping the second region, e.g., a peripheral circuit region, the step height difference can be prevented/reduced between the first region and the second region. As a result, the stability in the process of forming the landing plugs and the buried gates is enhanced.

Moreover, the height of the landing plugs formed in the first region can be secured to be substantially the maximum and the height of the device isolation layer remaining in the second region can be maintained at a uniform level. As a result, a transistor may be formed to have stability in terms of threshold voltage in the peripheral circuit region.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    sequentially stacking a pad oxide layer and a hard mask layer over a substrate;
    forming a device isolation layer over a trench in the substrate, wherein the trench is formed by etching the pad oxide layer and the substrate using the hard mask layer as an etch barrier;
    forming a capping layer pattern comprising two layers configured to open a first region of the substrate and cover a second region of the substrate;
    removing the hard mask layer from the first region;
    removing the capping layer pattern; and
    completely removing the pad oxide layer from the first region after removing the capping layer pattern.

2. The method of claim 1, further comprising, after the removing of the pad oxide layer:
    forming pre-landing plugs over the substrate of the first region; and
    forming landing plugs in the first region by etching the pre-landing plugs.

3. The method of claim 2, further comprising:
    forming a buried gate trench by etching the substrate exposed between the landing plugs;
    forming a buried gate filling a portion of the buried gate trench; and
    forming a gap-filling layer gap-filling an upper portion of the buried gate trench.

4. The method of claim 2, wherein the forming of the pre-landing plugs comprises:
    forming a plug conductive layer over the substrate from which the pad oxide layer is removed; and
    isolating the plug conductive layer.

5. The method of claim 1, wherein the forming of the device isolation layer comprises:
    forming a device isolation mask over the hard mask layer;
    etching the hard mask layer by using the device isolation mask as an etch barrier;
    forming an insulation layer gap-filling the trench; and
    planarizing the insulation layer until the hard mask layer is exposed.

6. The method of claim 1, wherein the capping layer pattern comprises a nitride layer.

7. The method of claim 1, wherein the capping layer pattern comprises a photoresist layer.

8. The method of claim 1, wherein the capping layer pattern comprises a polysilicon layer.

9. The method of claim 1, wherein the hard mask layer comprises a polysilicon layer.

10. The method of claim 9, wherein the capping layer pattern comprises a single layer of a nitride layer or a stacked structure of a nitride layer and a polysilicon layer.

11. The method of claim 1, wherein the hard mask layer comprises a nitride layer.

12. The method of claim 11, wherein the capping layer pattern comprises a single layer of a polysilicon layer or a stacked structure of a polysilicon layer and a nitride layer.

13. The method of claim 1, wherein the first region comprises a cell region of the semiconductor device, and the second region comprises a peripheral circuit region of the semiconductor device.

14. A method for fabricating a semiconductor device, comprising:
    sequentially stacking a pad oxide layer and a first polysilicon layer over a substrate;
    forming a device isolation layer over the substrate;

forming a second polysilicon layer pattern configured to open a first region of the substrate and cover a second region of the substrate;

removing the second polysilicon layer pattern and the first polysilicon layer of the first region; and removing the pad oxide layer of the first region.

15. The method of claim 14, further comprising, after the removing of the pad oxide layer of the first region:

forming pre-landing plugs over the substrate of the first region; and forming landing plugs in the first region by etching the pre-landing plugs.

16. The method of claim 15, further comprising:

forming a buried gate trench by etching the substrate exposed between the landing plugs;

forming a buried gate filling a portion of the buried gate trench; and forming a gap-filling layer gap-filling an upper portion of the buried gate trench.

17. The method of claim 15, wherein the forming of the pre-landing plugs comprises:

forming a plug conductive layer over the substrate from which the pad oxide layer is removed; and isolating the plug conductive layer.

18. The method of claim 14, wherein the forming of the device isolation layer comprises:

forming a device isolation mask over the first polysilicon layer;

etching the first polysilicon layer by using the device isolation mask as an etch barrier;

forming a trench by etching the pad oxide layer and the substrate using the first polysilicon layer as an etch barrier;

forming an insulation layer gap-filling the trench; and planarizing the insulation layer until the first polysilicon layer is exposed.

19. The method of claim 14, wherein the first region comprises a cell region of the semiconductor device, and the second region comprises a peripheral circuit region of the semiconductor device.

* * * * *